United States Patent [19]
Johnson et al.

[11] Patent Number: 5,987,576
[45] Date of Patent: Nov. 16, 1999

[54] METHOD AND APPARATUS FOR GENERATING AND DISTRIBUTING CLOCK SIGNALS WITH MINIMAL SKEW

[75] Inventors: Leith L. Johnson, Fort Collins, Colo.; David A. Fotland, San Jose, Calif.

[73] Assignee: Hewlett-Packard Company, Palo Alto, Calif.

[21] Appl. No.: 08/807,161

[22] Filed: Feb. 27, 1997

[51] Int. Cl.$^6$ .................................................. G06F 1/00
[52] U.S. Cl. ............................ 711/167; 711/100; 711/154
[58] Field of Search ............................. 327/161; 375/372, 375/356; 359/140; 395/304, 558, 551; 370/505; 385/24; 711/167, 100, 154

[56] References Cited

U.S. PATENT DOCUMENTS

| | | | |
|---|---|---|---|
| 4,658,161 | 4/1987 | Spencer | 327/161 |
| 5,243,703 | 9/1993 | Farmwald et al. | 395/325 |
| 5,323,426 | 6/1994 | James et al. | 375/372 |
| 5,432,823 | 7/1995 | Gasbarro et al. | 375/356 |
| 5,434,817 | 7/1995 | Ware et al. | 365/189.01 |
| 5,442,475 | 8/1995 | Bausman et al. | 359/140 |
| 5,444,858 | 8/1995 | Wakerly | 395/304 |
| 5,499,385 | 3/1996 | Farmwald et al. | 395/823 |
| 5,504,752 | 4/1996 | Okazaki et al. | 370/505 |
| 5,511,024 | 4/1996 | Ware et al. | 365/189.04 |
| 5,513,327 | 4/1996 | Farmwald et al. | 395/309 |
| 5,537,498 | 7/1996 | Bausman et al. | 385/24 |
| 5,578,940 | 11/1996 | Dillon et al. | 326/30 |
| 5,625,805 | 4/1997 | Fenwick et al. | 395/558 |
| 5,692,165 | 11/1997 | Jeddeloh et al. | 395/551 |
| 5,712,882 | 1/1998 | Miller | 375/356 |
| 5,734,685 | 3/1998 | Bedell et al. | 375/356 |

OTHER PUBLICATIONS

Memory Latency Comparison, Sep. 6, 1996, downloaded from website: www.rambus.com Feb. 25, 1997, pp. 1–8.

Rambus Memory: Multi–Gigabytes/Second & Minimum System Cost, downloaded from website: www.rambus.com Feb. 25, 1997, pp. 1–4.

64–Megabit Rambus DRAM Product Summary, Nov. 29, 1995, downloaded from website: www.rambus.com Feb. 25, 1997, pp. 1–11.

64–Megabit Rambus DRAM Technology Directions, downloaded from website: www.rambus.com Feb. 25, 1997, pp. 1–24.

Rambus Memory: Enabling Technology For PC Graphics, downloaded from website: www.rambus.com Feb. 25, 1997, pp. 1–16.

3D Graphics Memory Architecture Comparison, downloaded from website: www.rambus.com Feb. 25, 1997, pp. 1–4.

Comparing RDRAM & SGRAM for 3D Applications, Oct. 29, 1996, downloaded from website: www.rambus.com Feb. 25, 1997, pp. 1–16.

Subodh Toprani, Rambus & UMA: The Win/Lose Debare, downloaded from website: www.rambus.com Feb. 25, 1997, pp. 1–2.

Subodh Toprani, Rambus Consumer Technology Powers the Nintendo 64, downloaded from website: www.rambus.com Feb. 25, 1997, pp. 1–2.

*Primary Examiner*—John W. Cabeca
*Assistant Examiner*—Fred F. Tzeng
*Attorney, Agent, or Firm*—David A. Plettner

[57] ABSTRACT

A memory controller and at least one memory module exchange data at high transfer rates by minimizing clock skew. When writing data to the memory module, the memory controller generates a clock signal that travels along a first clock line segment. The data bus carries the write data, and the electrical characteristics of the data bus and first clock line segment are matched such that incident wavefronts of the data bus and clock signal arrive at the memory module in fixed relation to one another. When reading data, the first clock line segment is looped back from the memory module to the memory controller along a second clock line segment, with a copy of the clock signal provided on the second clock line segment. The data bus carries the read data, and the electrical characteristics of the data bus and the first clock line segment are matched such that incident wavefronts of the data bus and clock signal arrive at the memory controller in fixed relationship to one another. The present invention provides a substantial increase in memory bandwidth with minimal design changes to prior art memory systems.

11 Claims, 4 Drawing Sheets

METHOD AND APPARATUS FOR GENERATING AND DISTRIBUTING CLOCK SIGNALS WITH MINIMAL SKEW

FIELD OF THE INVENTION

The present invention relates to generating and distributing clock signals in digital systems. More specifically, the present invention relates to minimizing skew in such clock signals.

DESCRIPTION OF THE RELATED ART

It is common for digital systems to send and receive data by placing data on a bus in harmony with a clock signal such that the data is valid on the bus at a time defined by an edge of the clock signal. Of course, it is also often desirable to transmit data as fast as possible, and therefore it is desirable to operate the clock signal at the highest possible frequency.

In a digital system having a component that reads data from a bus, the maximum frequency at which a clock signal can operate is primarily limited by three factors; the set-up time of the data with respect to the clock signal, the hold time of the data with respect to the clock signal, and clock skew. Clock skew can include clock-to-clock skew wherein an edge of a clock signal is skewed with respect to the same edge of the clock signal in a different portion of a circuit, and clock-to-data skew wherein an edge of a clock is skewed with respect to data on a bus.

In digital systems it is common to have many components coupled to a single clock signal, and it is impractical to have a single driver circuit drive the clock inputs of all the components. Therefore, clock buffers are used to make copies of the clock signal for distribution to all components that need the clock signal. However, clock buffers introduce clock skew. To attempt to minimize clock skew, prior art configuration often have clock buffers arranged in a tree-like clock distribution network such that the clock signal supplied to each component traverses the same number of clock buffers. While such arrangements help, there can be significant deviations in skew between clock buffers.

In the field of computing, synchronous dynamic random access memories (SDRAMs) are often used to provide main memory storage in a computer system. Typically, the SDRAMs used in a computer system are mounted onto single in-line memory modules (SIMMs) or dual in-line memory modules (DIMMs), which are then inserted into DIMM or SIMM sockets on a board of the computer system. As is discussed below in the section entitled Detailed Description of the Preferred Embodiments, clock skew found in prior art SIMM and DIMM configurations effectively limits the clock frequency at which SDRAMs are accessed to approximately 100 MHz. In such configurations, the logic state associated with each clock pulse propagates completely through the clock distribution network before the logic state switches.

Since the clock frequency at which SDRAMs operate is limited to 100 MHz, computer designers have focused on increasing the data path width of memory systems to increase memory bandwidth. However, this approach is expensive. As data path widths increase from 64 bits to 128 bits, 256 bits, and beyond, the number of circuit board traces, along with the required circuit board space, becomes prohibitive.

U.S. Pat. No. 5,432,823 to Gasbarro et al. is entitled "Method and Circuitry for Minimizing Clock-Data Skew in a Bus System" and is assigned to Rambus, Inc (the term Rambus® is a registered trademark of Rambus, Inc.). By using the skew minimization techniques taught by Gasbarro et al., as well as several other techniques, Rambus has been able to commercially produce memory subsystems that operate at speeds up to 500 MHz using the same type of dynamic random access memory (DRAM) core used in SDRAMs. At such frequencies, the clock distribution network may simultaneously have more than one clock pulse "in-transit" to a component coupled to the network. The Rambus design provides a large increase in memory bandwidth without having to dramatically increase the width of the data bus.

FIG. 1 is a block diagram adapted from FIG. 3 of Gasbarro et al. and illustrates how clock skew is minimized in Rambus memory systems. In FIG. 1, digital system 10 comprises master receiver/transmitter 12 and slave receiver/transmitters 14, 16, 18, and 20. Master receiver/transmitter 12 and slave receiver/transmitters 14, 16, 18, and 20 are coupled to a data bus 22 and clock distribution system 24. Clock distribution system 24 comprises clock source 25 and clock line 27.

Because of the high frequencies at which clock distribution system 24 operates, clock line 27 may contain more than one clock pulse at any given time. Therefore, the clock pulse present at one receiver/transmitter may not correspond to the clock pulse present at another receiver/transmitter. To address this problem, Gasbarro et al. discloses using two separate segments of clock line 27. The first segment is ClockToMaster 28 and the second segment is ClockFromMaster 26. The two segments are coupled at end 29. Each segment has the same approximate length and electrical characteristics of the conductors of data bus 22.

Segment 26 is used when data is transmitted from master receiver/transmitter 12 to one of the slave receiver/transmitters. For example, consider a write operation from master receiver/transmitter 12 to slave receiver/transmitter 20. A clock pulse is generated at clock source 25 and traverses first segment 28 and end 29. As the pulse begins to traverse second segment 26, it enters the $TCLK_0$ input of master receiver/transmitter 12, which causes master receiver/transmitter 12 to drive data onto data bus 22. The data propagates on data bus 22 roughly in parallel with the clock pulse that entered the $TCLK_0$ input until the clock pulse reaches $RCLK_3$ input of slave receiver/transmitter 20, at which point slave receiver/transmitter 20 clocks in the data. Since the portion of segment 26 traversed by the clock pulse is matched to the portion of data bus 22 traversed by the data, minimal clock skew is introduced. Segment 28 is used in a similar manner when performing a read operation from one of the slaver receiver/transmitters to master receiver/transmitter 12.

Accordingly, each receiver/transmitter 12, 14, 16, 18, and 20 must be able to couple data onto data bus 22 at the instant that its active clock travels past. Gasbarro et al. describe this as being analogous to surfing, in which the surfer watches and anticipates the crest of the wave to catch it and travel with it.

Having two separate clocks coupled to each receiver/transmitter creates synchronization problems within each receiver/transmitter. For a device coupled close to end 29, the phase difference between the transmit clock and the receive clock is minimal. However, devices at the other end, such as slave receiver/transmitter 20, may see a substantial phase difference between the transmit clock and the receive clock. Accordingly, if receiver/transmitters are to be interchangeable and able to assume any position with respect to end 29, each receiver/transmitter must include synchronization circuitry that is able to account for different phase relationships between the transmit and receive clocks.

FIG. 2 is a block diagram of a Rambus 64 megabit DRAM 30 and is adapted from a Rambus 64-Megabit Rambus DRAM Product Summary published Nov. 29, 1995. DRAM 30 is configured as a slave receiver/transmitter, with a Rambus controller configured as a master receiver/transmitter. DRAM 30 is coupled to ClockFromMaster segment 26 and ClockToMaster segment 28, as well as various control and data signals. The purpose in showing FIG. 2 is to illustrate the relative complexity of DRAM 30. As disclosed by Gasbarro et al., each receiver/transmitter must have a phase locked loop to generate phase-shifted versions of the transmit clock. In addition, within each receiver/transmitter, each data line must have a delay element, a phase comparator, a mux, a latch, and several additional stages.

While Rambus memory systems have successfully achieved high transfer frequencies, the design is quite complex and very different from prior art memory subsystems. Phase locked loops can be difficult to implement in high density CMOS implementations, and are susceptible to switching noise frequently present in CMOS memory subsystems. More importantly, phase locked loops are not compatible with clock stopping techniques that are used for reducing power and latency because phase locked loops require a start-up period to lock onto a signal. What is needed in the field of computing is a memory design that is similar to prior art SIMM and DIMM configurations, yet achieves transfer frequencies similar to those achieved by Rambus memory systems.

SUMMARY OF THE INVENTION

The present invention is a method and apparatus for generating and distributing clock signals with minimal skew. In one embodiment, the present invention includes a memory controller and at least one memory module that exchange data at high transfer rates by minimizing clock skew. When writing data to the memory module, the memory controller generates a clock signal that travels along a first clock line segment. The data bus carries the write data and the electrical characteristics of the data bus and first clock line segment are matched such that incident wavefronts of the data bus and clock signal arrive at the memory module in fixed relation to one another. When reading data, the first clock line segment is looped back from the memory module to the memory controller along a second clock line segment, with a copy of the clock signal provided on the second clock line segment. The data bus carries the read data and the electrical characteristics of the data bus and the second clock line segment are matched such that incident wavefronts of the data bus and clock signal arrive at the memory controller in fixed relationship to one another.

In one configuration, the memory module is provided with dummy loads that are coupled to the second clock segment. The dummy load ensure that the electrical characteristics of the second clock segment track the electrical characteristics of the data bus as memory modules are inserted and removed.

The present invention provides a substantial increase in memory bandwidth with minimal design changes to prior art memory modules. In one embodiment, a prior art memory module may be configured to operate in accordance with the present invention simply by coupling an output from a clock buffer on the memory module to an unused pin of the memory module.

DETAILED DESCRIPTION OF THE PREFERRED EMBODIMENTS

Figure 3:
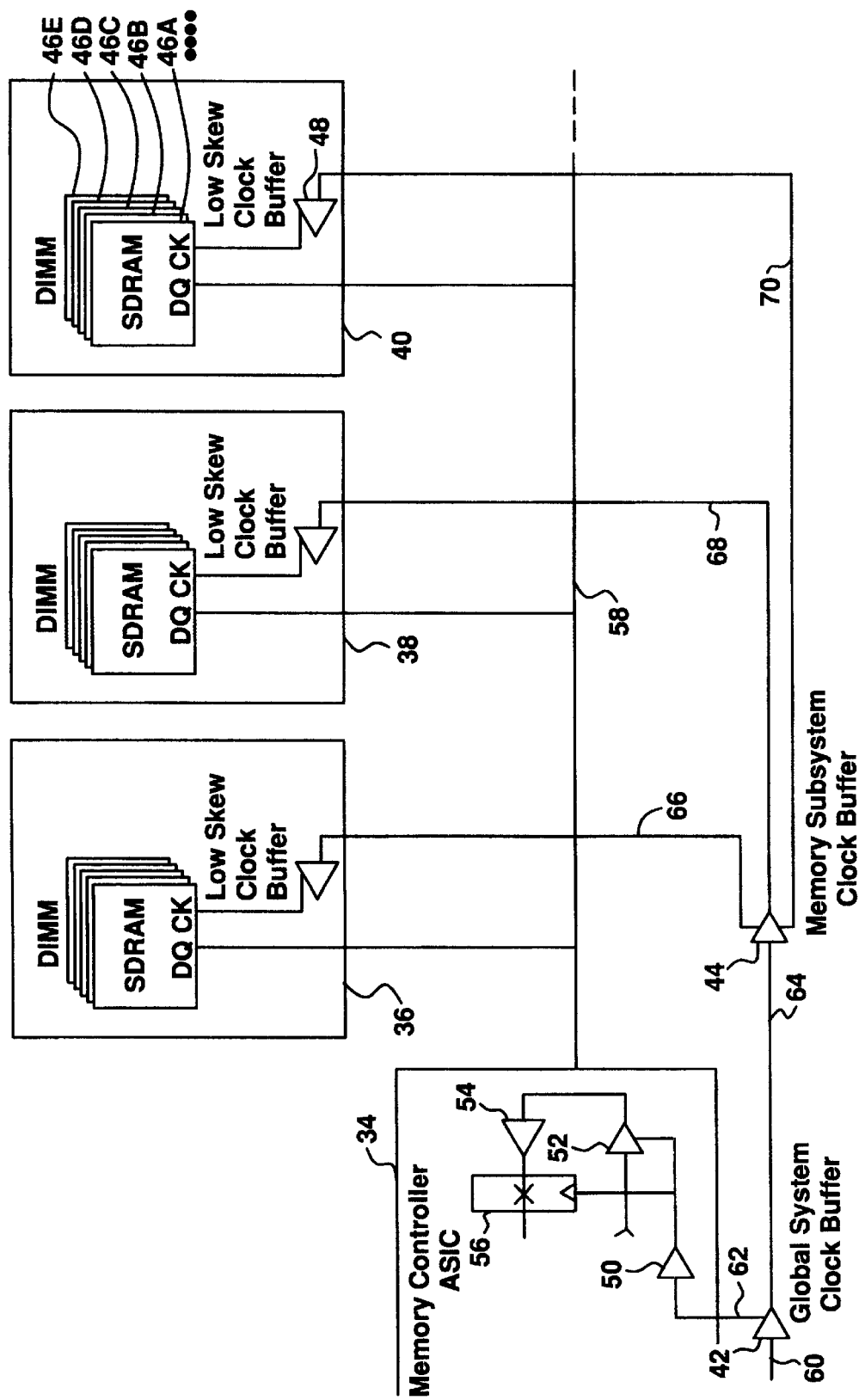
FIG. 3 is a block diagram of a prior art memory system using dual in-line memory modules (DIMM).

FIG. 3 is a block diagram of a prior art memory system 32. Memory system 32 includes memory controller application-specific integrated circuit (ASIC) 34, dual in-line memory modules (DIMMs) 36, 38, and 40, global system clock buffer 42, and memory subsystem clock buffer 44. Each DIMM module includes one or more synchronous dynamic random access memory (SDRAM) circuits and a low skew clock buffer. For example, DIMM 40 includes SDRAMs 46A, 46B, 46C, 46D, and 46E and low skew clock buffer 48.

Memory controller ASIC 34 includes an internal clock buffer 50, data bus drivers 52, data receivers 54, and data registers 56. Data bus 58 is coupled to memory controller ASIC 34 and each of the DIMM modules 36, 38, and 40. Clock signals are distributed to ASIC 34 by the clock distribution network comprised of clock buffers 42 and 44. Buffer 42 receives a master clock signal on line 60, and fans that signal to ASIC 34 via line 62 and buffer 44 via line 64. Buffer 44 fans out the clock signal to DIMMs 36, 38, and 40 via lines 66, 68, and 70, respectively.

As discussed above in the section entitled Description of the Related Art, the frequency at which a clock signal can operate is primarily limited by three factors; the set-up time of the data with respect to the clock signal, the hold time of the data with respect to the clock signal, and clock skew. Skew is a term that is well known in the art of computing. Briefly, skew is the difference between the minimum and maximum times it takes for an event to occur. Skew is additive, so if a signal traverses two gates, and each gate has a skew of 1.0 nS, the total skew is 2.0 nS. To calculate total skew of a circuit, one starts at a point where clock and data, for example, are gated by a common device or exist on at a common point of a net, such as a clock net or clock buffer that drives both an output driver and a clock buffer. From that point, one adds the skew for all devices traversed until the signals reconverge at a clocked device, such as a register, or an output pin. Setup and hold times must also be included when calculating minimum allowable cycle time. An example of such a calculation is set forth below.

One type of skew arises from the total propagation delay (TPD) time of a device as a signal propagates from the input of the device to the output of the device. This type of skew will be referred to herein as TPD skew. Another type of skew arises between potential time differences observed at separate outputs of a device. This type of skew will be referred to herein as output-to-output skew.

Output-to-output skew is easy to control because it is a function of a single semiconductor device whose transistors are fundamentally matched. The single device has a common temperature and common voltage, and any variations caused be fabrication anomalies affect all outputs, and therefore cancel out. On the other hand, TPD skew is much larger because it reflects potential differences in separate semiconductor devices. For example, a typical TPD skew of memory subsystem clock buffer 44 is 1.000 nS, while a typical output-to-output skew is 0.175 nS. Typically, the TPD skew of a device includes the output-to-output skew of a device, so the output-to-output skew of a device is only a factor when the TPD skew is not relevant.

Prior art SDRAM ICs have a setup time of approximately 2.5 nS, a hold time of approximately 1.0 nS, and a TPD skew from clock-to-data of approximately 3.0 nS. However, it is the belief of the inventors of the present invention that these times can and will be improved significantly by using various techniques, such as compensating the delay of the SDRAM output buffers to reduce skew. The inventors anticipates that future versions of SDRAMs will have a setup time of approximately 0.5 nS, a hold time of approximately 0.25 nS, and a TPD skew of approximately 0.75 nS.

As will be shown below, using prior art SDRAM ICs the present invention increases the maximum operating frequency of a memory system constructed from SDRAMs improves by a factor of nearly two. However, using SDRAM ICs having timing characteristics similar to those anticipated by the inventors, the present invention increases the maximum operating frequency by a factor of approximately three to four.

The following timing budgets are calculated using times from prior art SDRAMS. The budgets set forth the setup and hold times and skew times of memory system 32 when performing read and write operations, and define the minimum allowable cycle time for system 32. All budgets assume first incident wavefront switching on data bus 58, wherein data is placed on a data bus as soon as the first wavefront of a clock pulse reaches an output buffer. First wavefront incident switching is easily achieved with the high performance CMOS FET transistors utilized in SDRAM and ASIC devices. The times below are representative of the times of such devices.

| SDRAM Read Budget for Memory System 32 Using Prior Art Components | | |
|---|---|---|
| Delay No. | Delay Description | Delay Time |
| 1 | Clock Buffer 42 Output-To-Output Skew | 0.175 nS |
| 2 | Clock Buffer 44 TPD Skew | 1.000 nS |
| 3 | DIMM Clock Buffer TPD Skew (e.g., Buffer 48) | 1.000 nS |
| 4 | SDRAM TPD Skew (e.g., SDRAM 46A) | 3.000 nS |
| 5 | Backplane TPD Skew (0.250 nS/Slot * 4 Slots) | 1.000 nS |
| 6 | ASIC 34 Internal Clock Buffer 50 TPD Skew | 2.000 nS |
| 7 | ASIC 34 Setup Time | 0.250 nS |
| 8 | ASIC 34 Hold Time | 0.250 nS |
| | Total: | 8.675 nS |
| | Maximum Cycle Frequency | 115.3 MHz |

| SDRAM Write Budget for Memory System 32 Using Prior Art Components | | |
|---|---|---|
| Delay No. | Delay Description | Delay Time |
| 9 | Clock Buffer 42 Output-To-Output Skew | 0.175 nS |
| 10 | ASIC 34 Internal Clock Buffer 50 TPD Skew | 2.000 nS |
| 11 | ASIC 34 Data Bus Driver 52 TPD Skew | 0.750 nS |
| 12 | Backplane TPD Skew (0.250 nS/Slot * 4 Slots) | 1.000 nS |
| 14 | SDRAM Setup Time (e.g., SDRAM 46A) | 2.500 nS |
| 15 | SDRAM Hold Time (e.g., SDRAM 46A) | 1.000 nS |
| 16 | Clock Buffer 44 TPD Skew | 1.000 nS |
| 17 | DIMM Clock Buffer TPD Skew (e.g., Buffer 48) | 1.000 nS |
| | Total: | 9.425 nS |
| | Maximum Cycle Frequency | 106.1 MHz |

The calculation of the read budget of circuit 32 starts at buffer 42. Since the outputs of buffer 42 are derived from line 60, only the output-to-output skew of buffer 40 is included in delay 1. Delays 2 and 3 are caused by the TPD skews of clock buffer 44 and the DIMM buffer (e.g., buffer 48), respectively. Delay 4 is the skew introduced by the clock and bus drivers found in each SDRAM.

In many computer systems, memory is organized into N memory subsystems, with each memory subsystem driving M DIMMs for a total of N*M DIMMs. Accordingly, in FIG. 3, M equals three. It takes about 0.250 nS for a signal to traverse the data bus between DIMMs, so in a three DIMM subsystem, the DIMM closest to the memory controller ASIC will receive data about 0.7500 nS before the farthest DIMM. In addition, a bus such as that shown in FIG. 3 will have propagation variation of approximately 0.250 nS. Since data must flow in both direction, the length of the clock line cannot be used to compensate for this delay. Accordingly, a designer must attempt to equalize the clock length flowing to the DIMMs such that the clock can be used for both read and write operations. Delay 5 accounts for propagation variation of 0.250 nS and the skew introduced by the fact that data traveling to different DIMMs traverses different lengths of data bus 58, while the clock signal travels approximately equal lengths. Of course, delay 5 will vary based on the number of DIMMs in a memory subsystem.

Delay 6 is the TPD skew of clock buffer 50 in ASIC 34. Delay 6 also includes the clock-to-data skew of ASIC 34. Delay 7 is the setup time of ASIC 34, and delay 8 is the hold time of ASIC 34. As seen above, the read budget of circuit 32 produces a maximum read cycle frequency 115.3 MHz.

The calculation of the write budget of circuit 32 also starts at buffer 42. Delay 9 is the output-to-output skew of clock buffer 42 and corresponds to delay 1 in the read budget. Delay 10 represents TPD skew of clock buffer 50 of ASIC 34 and corresponds to delay 6 in the read budget. Delay 11 is the TPD skew of bus driver 52 of ASIC 34. Delay 12 is the delay associated with the DIMM backplane and corresponds to delay 5 of the write budget. Delays 14 and 15 are the setup time and the hold time, respectively, of the SDRAM ICs, such as SDRAM 46A. Delay 16 is the TPD skew of clock buffer 44, and delay 17 is the TPD skew of a DIMM clock buffer, such as buffer 48. As seen above, the write budget of circuit 32 produces a maximum write cycle frequency 106.1 MHz, which is the maximum frequency at which circuit 32 may operate.

Figure 4:
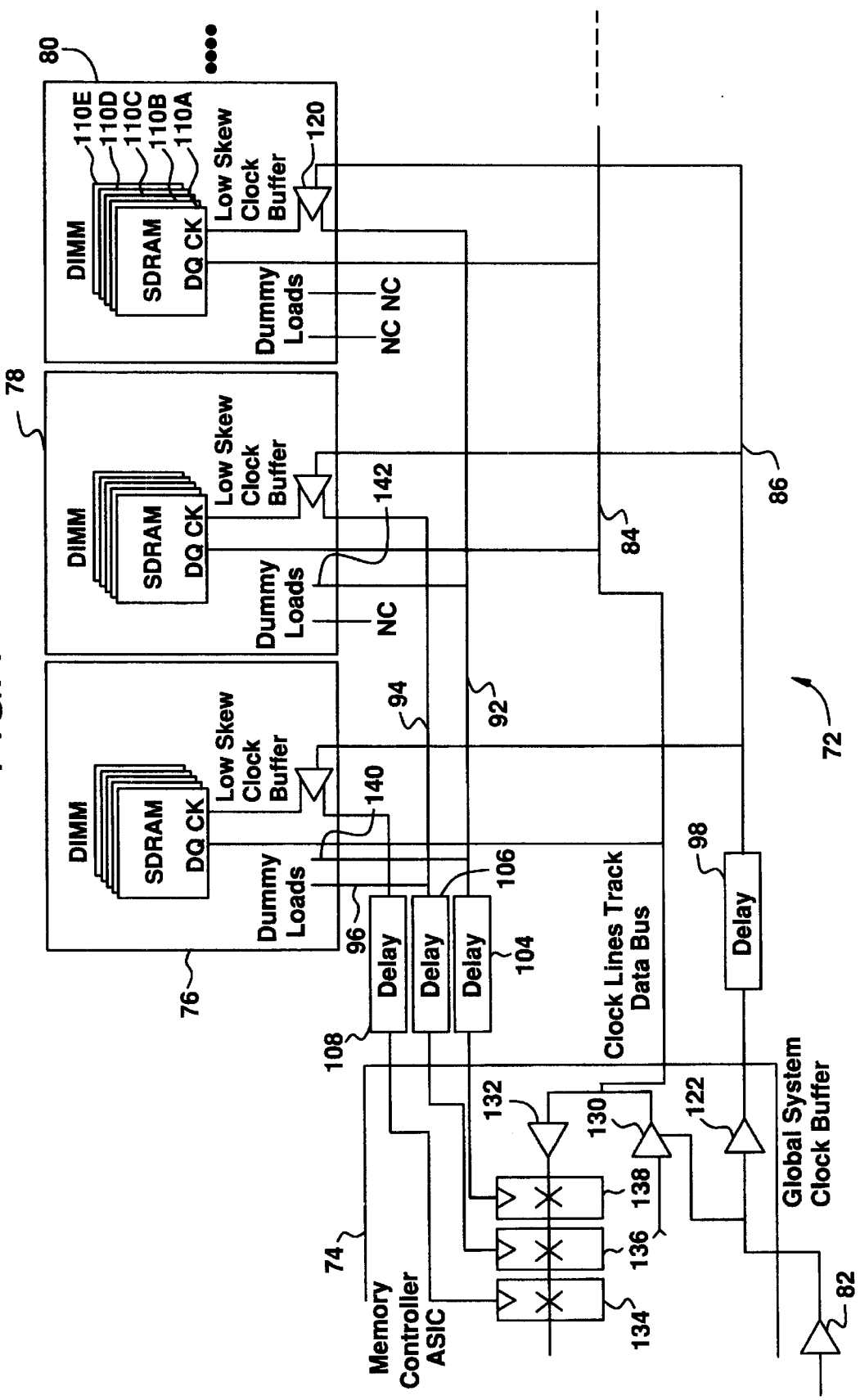
FIG. 4 is a block diagram of a memory system in accordance with the present invention.

FIG. 4 is a block diagram of a memory system 72 in accordance with the present invention. Memory system 72 includes memory controller ASIC 74, DIMMs 76, 78, and 80, global system clock buffer 82, data bus 84, clock lines 86, 92, 94, and 96 and delay lines 98, 104, 106, and 108. Each of the clock lines is provided with one of the delay lines. Each DIMM includes a clock buffer and at least one SDRAM IC. For example, DIMM 80 has SDRAMs 110A, 110B, 110C, 110D, and 110E, and buffer 120. Each DIMM clock buffer has outputs that are coupled to the clock inputs of the SDRAMs. In addition, one line of each clock buffer is sent back to ASIC 74 via a clock line. Each DIMM also has connections for dummy loads, which will be described in greater detail below.

Memory controller ASIC 74 includes a clock driver 122, data bus drivers 130, data bus receivers 132, and registers 134, 136, and 138. Registers 134, 136, and 138 are clocked by clock signals provided by the clock buffers on the DIMMs.

Figure 1:
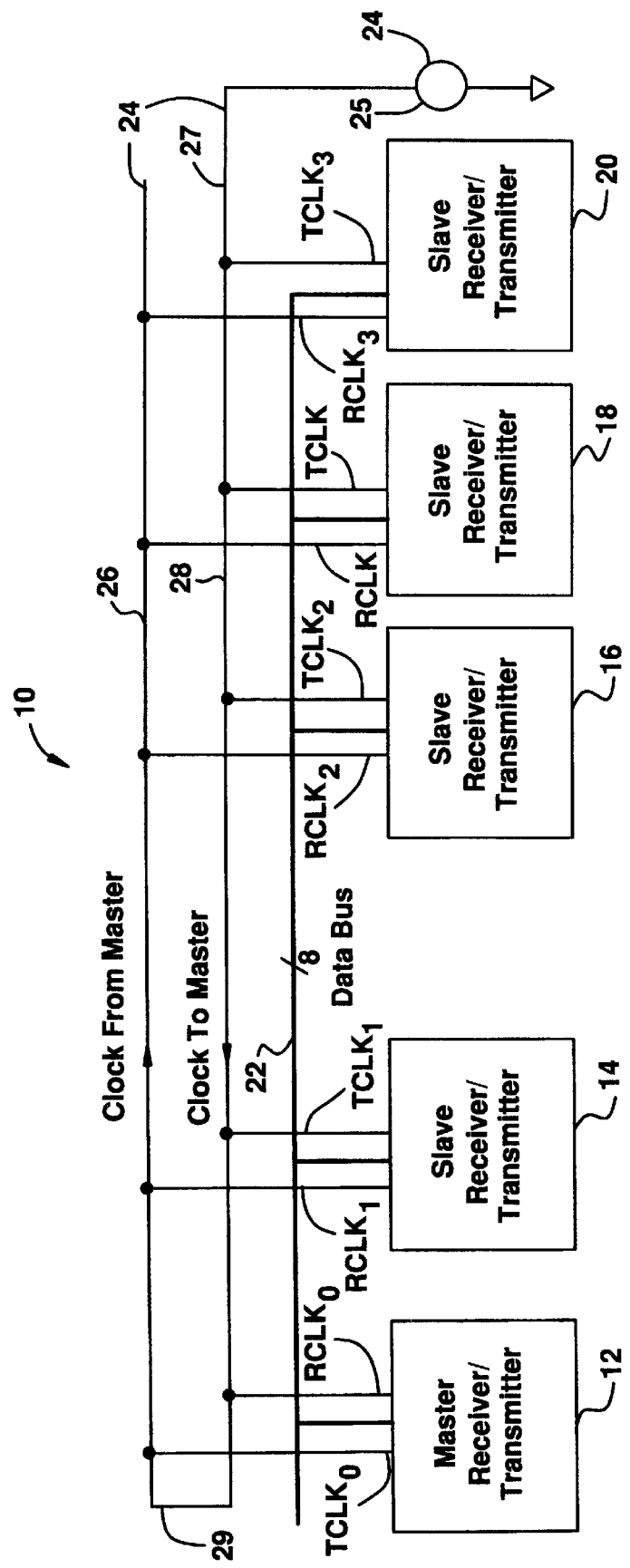
FIG. 1 is a block diagram adapted from FIG. 3 of U.S. Pat. No. 5,432,823 to Gasbarro et al. and illustrates how clock skew is minimized in Rambus memory systems.
Figure 2:
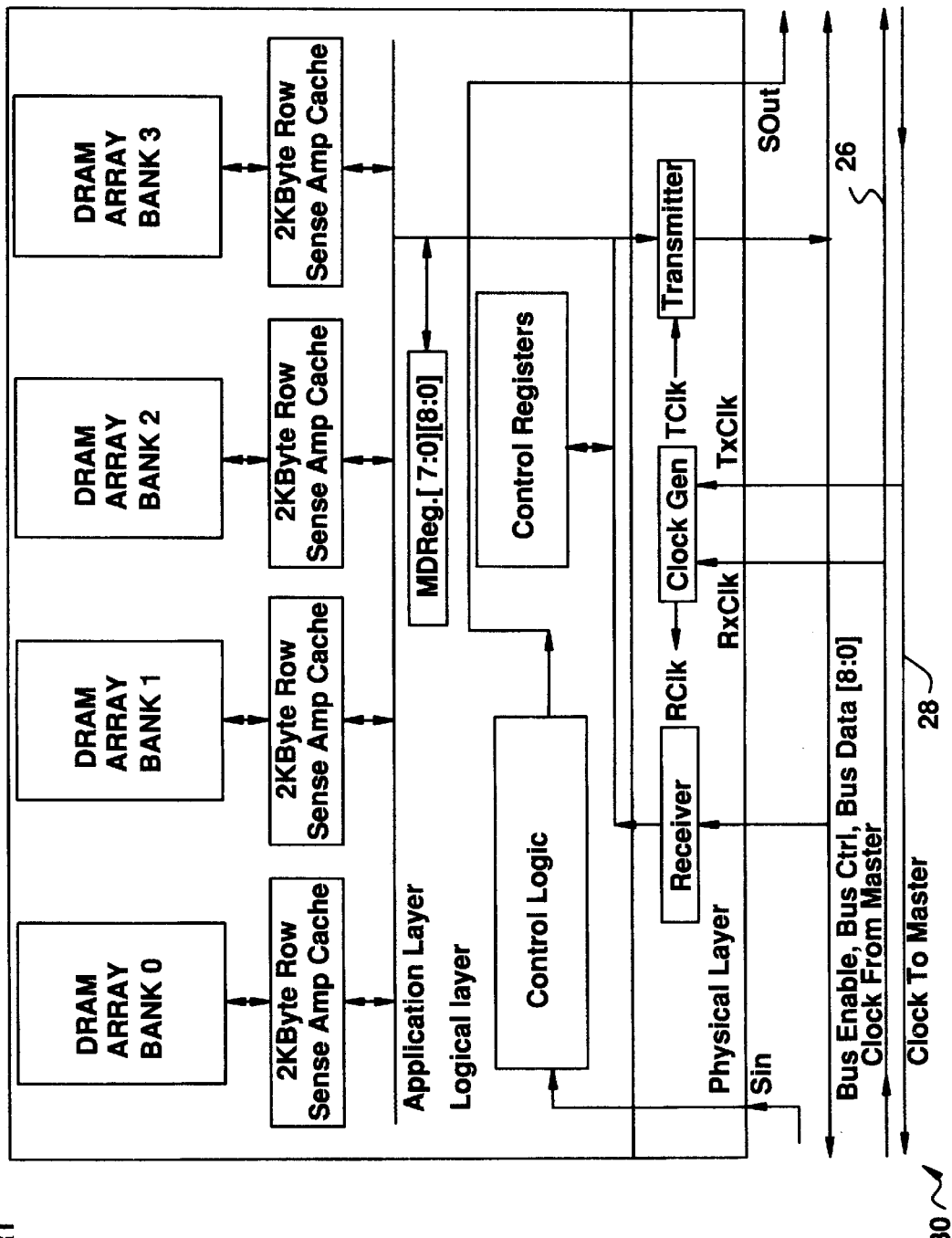
FIG. 2 is a block diagram of a Rambus 64 megabit DRAM and is adapted from a Rambus 64-Megabit Rambus DRAM Product Summary published Nov. 29, 1995.

A fundamental difference between prior art memory system 32 of FIG. 3 and memory system 72 of the present invention is that the clock that is used by ASIC 74 to clock in read data from a DIMM is provided by the clock buffer on that DIMM. Therefore, clock pulses always travel in the same direction as data. By designing clock lines that have electrical characteristics that correspond to data bus 84, the present invention is able to provide a substantial improvement in the maximum allowable cycle frequency of a memory subsystem. A detailed discussion of these techniques will be presented in view of the SDRAM read and write budgets for circuit 72. The following timing budgets set forth the setup and hold times and skew times of memory circuit 72 when performing read and write operations and define the minimum allowable cycle time for circuit 72. All budgets assume first incident wavefront switching on data bus 84. To show the benefits of the present invention, the timing budgets are calculated using prior-art clock buffers, SDRAMs, and ASICs having timing characteristics identical to those shown in FIG. 3. However, the clock and data paths on the circuit board that connect the clock buffers, SDRAMs, and ASICs must be closely matched, as will be discussed below. To aid in comparing the present invention to prior art memory system 32 of FIG. 1, the delay reference numbers used below are unique from those used above.

SDRAM Read Budget for Memory System 72
Using Prior Art Components

| Delay No. | Delay Description | Delay Time |
| --- | --- | --- |
| 18 | DIMM Clock Buffer Output-To-Output Skew (e.g., Buffer 120) | 0.175 nS |
| 19 | SDRAM TPD Skew (e.g., SDRAM 110A) | 3.000 nS |
| 20 | Backplane TPD Skew | 0.250 nS |
| 21 | ASIC 74 Data-To-Clock Skew | 0.250 nS |
| 22 | ASIC 74 Data Setup Time | 0.250 nS |
| 23 | ASIC 74 Data Hold Time | 0.250 nS |
|  | Total: | 4.175 nS |
|  | Maximum Cycle Frequency | 239.5 MHz |

SDRAM Write Budget for Memory System 72
Using Prior Art Components

| Delay No. | Delay Description | Delay Time |
| --- | --- | --- |
| 24 | ASIC 74 Clock Driver-To-Data Driver Skew | 0.500 nS |
| 25 | Backplane TPD Skew | 0.250 nS |
| 27 | SDRAM Setup Time (e.g., SDRAM 110A) | 2.500 nS |
| 28 | SDRAM Hold Time (e.g., SDRAM 110A) | 1.000 nS |
| 29 | DIMM Clock Buffer TPD Skew (e.g., Buffer 120) | 1.000 nS |
|  | Total: | 5.250 nS |
|  | Maximum Cycle Frequency | 190.5 MHz |

In memory system 32 of FIG. 3, the calculation of the read budget started at global system clock buffer 42. In the present invention, the clock that is used by ASIC 74 to validate read data is provided by the DIMM clock buffer. One of the advantages provided by this is that the calculation of the read budget begins at a DIMM clock buffer. This eliminates the skew from the global system clock buffer and the memory subsystem clock buffer, and converts the skew of the DIMM clock buffer from a TPD skew to and output-to-output skew. As discussed above, output-to-output skews are much smaller than TPD skews. Accordingly, delay 18 is the output-to-output skew of a DIMM clock buffer, such as buffer 120.

Delay 19 is the SDRAM TPD skew. This delay corresponds with delay 4 of system 32.

As discussed above with respect to FIG. 3, prior art memory system 32 has significant backplane skew. However, in FIG. 4, the clock line running from each DIMM to ASIC 74 is precisely matched to the corresponding data lines of bus 84. In addition, data from each DIMM is clocked into corresponding and separate registers in ASIC 74. For example, data from DIMM 78 is clocked into register 136. The result is that the propagation delay due to the backplane connection between DIMMs is minimized and does not change with the number of DIMMs. Accordingly, delay 20 represents the propagation variation of 0.250 nS associated with bus 84, but does not include skew introduced by data traversing different lengths of data bus 58.

Delay 21 is data-to-clock skew of ASIC 74. In circuit 32, this time was included in the TPD skew of internal clock buffer 50 of ASIC 34 (delay 6). By supplying the clock and data from the DIMMs along matched lines, the present invention substitutes a TPD skew with a much smaller data-to-clock skew.

Delays 22 and 23 are the data setup time and data hold time, respectively, of ASIC 74. These times correspond with delays 7 and 8 of system 32. As seen above, the read budget of circuit 72 produce a maximum read cycle frequency 239.5 MHz. This is a vast improvement over the maximum read cycle frequency of 115.3 MHz provided by circuit 32. However, both circuits use components have similar timing characteristics.

In the present invention, when reading data from the DIMMs, the clock and data originate from the DIMMs and travel along matched lines. Likewise, when writing data to the DIMMs, the clock and data originate from ASIC 74 and travel along matched lines.

In memory system 32 of FIG. 3, the calculation of the write budget started at global system clock buffer 42. In memory system 72 of the present invention, the calculation of the write budget starts at the clock and data outputs of ASIC 74. By routing the clock into and out of ASIC 74, the skew generated by the global system clock buffer is eliminated and the internal clock buffer skew of the ASIC is substituted with a clock driver-to-data driver skew, which is much smaller because ASIC 74 is a single device. Delay 24 is the clock driver-to-data driver skew of ASIC 74.

As discussed above, the present invention minimizes backplane skew. Delay 25 is the back plane skew.

Delays 27 and 28 are the setup time and hold time of the SDRAMs, such as SDRAM 110A. Delays 27 and 28 correspond to delays 14 and 15, respectively, of memory system 32.

Delay 29 is the DIMM clock buffer TPD skew (such as buffer 120) and corresponds to delay 17 of system 32. As seen above, the write budget of circuit 72 produces a maximum read cycle frequency 190.5 MHz, a significant improvement over the maximum read cycle frequency of 106.1 MHz provided by system 32. Accordingly, the memory system of the present invention operates at 190.5 MHz while the memory system of the prior art operates at 106.1 MHz. The present invention therefore provides an 80% improvement in maximum operating frequency using prior art components.

The components used to calculate the read and write budgets of system 72 have timing characteristics identical to those of prior art system 32 of FIG. 3. However, with such components there is a significant discrepancy between the read cycle timing (239.5 MHz) and the write cycle timing (190.5 MHz) of memory system 72. With a minor component substitution, this discrepancy can be reduced substantially.

The value of the TPD skew of the clock buffers used on the DIMMS in systems 32 and 72 is 1.000 nS. This corresponds with low-voltage TTL clock buffers commonly used on DIMMS. However, if a higher cost ECL clock buffer is used on each DIMM, the TPD skew of the buffer drops to 0.200 nS. This drops the total minimum allowable write cycle time to 4.45 nS, and therefore raises the maximum allowable write frequency to 224.7 MHz, thereby moving the write frequency closer to the read frequency. This substitution also provides a small increase in the maximum allowable read frequency because the output-to-output skew of the DIMM clock buffer is also reduced, though to a lesser extent.

Now assume that the prior art memory system 32 and memory system 72 of the present invention are constructed using future versions of SDRAMs having a setup time of approximately 0.5 nS, a hold time of approximately 0.25 nS, and a TPD skew of approximately 0.75 nS, as anticipated by the inventors. The read and write budgets are as follows:

SDRAM Read Budget for Memory System 32
Using Future Components

| Delay No. | Delay Description | Delay Time |
| --- | --- | --- |
| 30 | Clock Buffer 42 Output-To-Output Skew | 0.175 nS |
| 31 | Clock Buffer 44 TPD Skew | 1.000 nS |
| 32 | DIMM Clock Buffer TPD Skew (e.g., Buffer 48) | 1.000 nS |
| 33 | SDRAM TPD Skew (e.g., SDRAM 46A) | 0.750 nS |
| 34 | Backplane TPD Skew (0.250 nS/Slot * 4 Slots) | 1.000 nS |
| 35 | ASIC 34 Internal Clock Buffer 50 TPD Skew | 2.000 nS |
| 36 | ASIC 34 Setup Time | 0.250 nS |
| 37 | ASIC 34 Hold Time | 0.250 nS |
|  | Total: | 6.425 nS |
|  | Maximum Cycle Frequency | 155.6 MHz |

SDRAM Write Budget for Memory System 32
Using Future Components

| Delay No. | Delay Description | Delay Time |
| --- | --- | --- |
| 38 | Clock Buffer 42 Output-To-Output Skew | 0.175 nS |
| 39 | ASIC 34 Internal Clock Buffer 50 TPD Skew | 2.000 nS |
| 40 | ASIC 34 Data Bus Driver 52 TPD Skew | 0.750 nS |
| 41 | Backplane TPD Skew (0.250 nS/Slot * 4 Slots) | 1.000 nS |
| 42 | SDRAM Setup Time (e.g., SDRAM 46A) | 0.500 nS |
| 43 | SDRAM Hold Time (e.g., SDRAM 46A) | 0.250 nS |
| 44 | Clock Buffer 44 TPD Skew | 1.000 nS |
| 45 | DIMM Clock Buffer TPD Skew (e.g., Buffer 48) | 1.000 nS |
|  | Total: | 6.675 nS |
|  | Maximum Cycle Frequency | 149.8 MHz |

Accordingly, prior art memory system 32 will operate 149.8 MHz when using future SDRAMs, as anticipated by the inventors.

SDRAM Read Budget for Memory System 72
Using Future Components

| Delay No. | Delay Description | Delay Time |
| --- | --- | --- |
| 46 | DIMM Clock Buffer Output-To-Output Skew (e.g., Buffer 120) | 0.175 nS |
| 47 | SDRAM TPD Skew (e.g., SDRAM 110A) | 0.750 nS |
| 48 | Backplane TPD Skew | 0.250 nS |
| 49 | ASIC 74 Data-To-Clock Skew | 0.250 nS |
| 50 | ASIC 74 Data Setup Time | 0.250 nS |
| 51 | ASIC 74 Data Hold Time | 0.250 nS |
|  | Total: | 1.925 nS |
|  | Maximum Cycle Frequency | 519.5 MHz |

SDRAM Write Budget for Memory System 72
Using Future Components

| Delay No. | Delay Description | Delay Time |
| --- | --- | --- |
| 52 | ASIC 74 Clock Driver-To-Data Driver Skew | 0.500 nS |
| 53 | Backplane TPD Skew | 0.250 nS |
| 54 | SDRAM Setup Time (e.g., SDRAM 110A) | 0.500 nS |
| 55 | SDRAM Hold Time (e.g., SDRAM 110A) | 0.250 nS |
| 56 | DIMM Clock Buffer TPD Skew (e.g., Buffer 120) | 1.000 nS |
|  | Total: | 2.5 nS |
|  | Maximum Cycle Frequency | 400.0 MHz |

Accordingly, memory system 72 will operate at 400.0 MHz when using future SDRAMs, as anticipated by the inventors. This is an improvement of 167% over prior art circuit 32. If ECL DIMM clock buffers are used in both circuit 32 and 72, the frequencies jump to 170 MHz and 588 MHz. With ECL buffers and future SDRAMS, memory system 72 is 246% faster than prior art memory system 32.

One of the advantages of prior art SIMMs and DIMMs is that they provide for easy installation and removal of memory. The dummy load connections on each DIMM allow the present invention to continue this advantage, without sacrificing performance. Basically, the dummy loads seek to duplicate on the clock lines the effect that adding additional DIMMS has on the data bus. For example, assume that data is being read from DIMM 80 to ASIC 74, and DIMMs 76 and 78 are installed. DIMM 80 must drive the capacitances of the portions of data bus 84 that extend into DIMMs 76 and 78, and dummy loads 140 and 142 duplicate the electrical effect of these portions, thereby keeping the electrical characteristics of clock line 92 and data bus 84 matched between DIMM 80 and ASIC 74. Now assume that DIMM 78 is removed. Removing DIMM 78 also removes a portion of data bus 84. However, it also removes dummy load 142, so the electrical characteristics of clock line 92 remain matched to those of data bus 84. The number of dummy loads that must be provided on each DIMM is equal to the number of DIMMs that may be placed in a memory subsystem minus one.

Delay line 98 may be needed to create the setup time needed by the SDRAMs when writing to the SDRAMs. The delay lines may simply be an additional routing length, or some other type of delay line as is known in the art. Alternatively, delay line 98 may be moved into ASIC 74, where it could be easy to make the delay of delay line 98 variable.

Likewise, delay lines 104, 106, and 108 may be needed to compensate for the SDRAM propagation delay and to create the setup time needed by ASIC 74. Delay lines 104, 106, and 108 may also be moved into ASIC 74, where it could be easy to make the delay of the delay lines variable.

The delay required by delay line 98 is dependant on the propagation delay of the DIMM clock buffers and the setup time required by the SDRAMs. Delay lines 98, 104, 106, and 108 may also be adjusted to center the clock in the middle of a valid data window so that clock and data arrive at the DIMMS and ASIC 74 with the proper phase relationship.

The present invention provides a substantial improvement in performance over prior art memory systems based on DIMMs and SIMMs with minimal changes to prior art DIMM and SIMM designs. A prior art DIMM design may be modified by simply routing an output of a clock buffer on the DIMM to an unused pin on the DIMM, and providing dummy loads on other unused pins as described above. An additional substantial gain in performance may be achieved by simply replacing a low-voltage TTL clock buffer on the DIMM with an ECL clock buffer.

Although the present invention provides substantial benefits when applied to current memory configurations, the concepts disclosed herein can provide even more benefits when SDRAMs are designed to operated with the present invention. For example, in a small system where the number of SDRAM packages is reduced such that the DIMM clock buffers are eliminated and the clock is provided directly to the SDRAM, and the SDRAM provides a clock out pin that can be sent along with the data to the memory controller ASIC, memory system frequencies may be increased even further. In such a configuration, the SDRAM TPD skew (0.750 nS) would be removed from the read budget, and the DIMM clock buffer output-to-output skew would be substituted with output-to-output skew at the outputs of the SDRAM. This would reduce the read cycle time to 1.175 nS and increase the maximum read cycle frequency to 851.0 MHz. Likewise, such a configuration would remove the DIMM clock buffer TPD skew (1.000 nS) from the write budget, which would reduce the write cycle time to 1.5 nS and increase the maximum read cycle frequency to 666.7 MHz.

The present invention has been described herein with reference to a memory controller and memory modules. However, those skilled in the art will recognize that the present invention may be adapted for use in many other type of digital systems wherein data is sent between first and second data blocks and is validated with a clock signal. In addition, some of the advantages of the present invention can be achieved by simply placing a shadow clock buffer proximate a DIMM socket, and the shadow clock buffer to generate the return clock. In this configuration, many of the advantages of the present invention may be achieved using prior-art DIMMS.

While the present invention provides a substantial improvement in performance over prior art DIMM and SIMM memory configurations, it also has several advantages over high speed prior art memory systems, such as those manufactured by Rambus, Inc. While such high speed prior art memory systems operate at frequencies greater than 500 MHz, they require complex phase detectors, phase locked loops, delay lines, and the like in order to manage clock skew. The present invention achieves speeds that are at least as fast without using such techniques. All that is required are several additional interconnections and careful attention to clock and data lines to ensure that their electrical characteristics are properly matched, and (optionally) the use of a high-speed clock buffer on each DIMM. Finally, since the present invention does not depend on phase locked loops, it is easy to employ clock stopping techniques that are used for reducing power and latency. Phase locked loops require a start-up period to lock onto a signal.

In conclusion, the present invention provides a low-cost, high-performance memory system solution that will meet the challenges created by future generations of processors that will operate at speed of many hundreds of megahertz. Although the present invention has been described with reference to preferred embodiments, workers skilled in the art will recognize that changes may be made in form and detail without departing from the spirit and scope of the invention.

What is claimed is:

1. A memory system comprising:

a memory controller;

a plurality of memory module sockets, with each memory module socket including a clock-in pin and a clock-out pin;

at least one memory module, with each memory module positioned in a memory module socket of the plurality of memory module sockets, wherein each memory module includes a clock-in pin in electrical contact with the clock-in pin of the memory module socket in which it is inserted, and a clock-out pin in electrical contact with the clock-out pin of the memory module in which it is inserted, wherein the signal provided at the clock-out pin of the memory module is derived from the signal provided at the clock-in pin of the memory module, wherein each memory module includes N dummy load pins coupled to a dummy load, wherein N represents the number of memory module sockets serviced by the memory controller minus one;

a first clock line network coupled to each of the clock-in pins of the memory module sockets; and a plurality of second clock lines corresponding to the plurality of memory module sockets, wherein each second clock line is coupled between the clock-out pin of one of the plurality of memory module sockets and the memory controller, and carries a second clock signal that validates at the memory controller data transmitted from a memory module inserted in the socket to the memory controller.

2. The memory system of claim 1 wherein one of the plurality of memory module sockets includes a dummy load pin coupled to one of the second clock lines provided at the clock-out pin of another memory module socket.

3. The memory system of claim 1 wherein each memory module further includes: a plurality of random access memory integrated circuits; and a clock buffer that receives the signal found at the clock-in pin of the memory module, and generates a plurality of clock buffer outputs, wherein a first clock buffer output of the plurality of clock buffer outputs is coupled to the clock-out pin of the memory module, and each random access memory circuit of the plurality of random access memory circuits is coupled to a remaining clock buffer output of the plurality of clock buffer outputs.

4. The memory system of claim 1 wherein the first clock line network includes a delay line that compensates for a setup delay required by the memory module.

5. The memory system of claim 1 wherein each second clock line includes a delay line that compensates for a memory module propagation delay and a setup delay required by the memory controller when reading from the memory module to the memory controller.

6. The memory system of claim 1 wherein the first clock line network is provided by the memory controller.

7. A memory system comprising:

a memory controller;

a plurality of memory module sockets with each memory module socket adapted to receive a memory module, each memory module socket including a clock-in pin and a clock-out pin;

a first clock line network coupled to each of the clock-in pins of the memory module sockets; and a plurality of second clock lines corresponding to the plurality of memory module sockets, wherein each second clock line is coupled between the clock-out pin of one of the plurality of memory module sockets and the memory controller, and carries a second clock signal that validates at the memory controller data transmitted from a memory module inserted in the socket to the memory controller, and wherein at least one of the plurality of memory module sockets includes a dummy load pin coupled to one of the second clock lines provided at the clock-out pin of another memory module socket.

8. The memory system of claim 7 wherein the first clock line network includes a delay line that compensates for a setup delay required by a memory module inserted into a memory module socket.

9. The memory system of claim 7 wherein each second clock line includes a delay line that compensates for a memory module propagation delay and a setup delay required by the memory controller when reading from a memory module inserted to the memory controller.

10. The memory system of claim 7 wherein the first clock line network is provided by the memory controller.

11. A memory module comprising:

a clock-in pin;

a clock-out pin, wherein a signal provided at the clock-out pin is derived from a signal provided at the clock-in pin;

N dummy load pins with each dummy load pin coupled to a dummy load;

a plurality of random access memory integrated circuits configured to receive a signal derived from the clock-in pin; and a clock buffer that receives the signal found at the clock-in pin, and generates a plurality of clock buffer outputs, wherein a first clock buffer output of the plurality of clock buffer outputs is coupled to the clock-out pin, and each random access memory circuit of the plurality of random access memory circuits is coupled to a remaining clock buffer output of the plurality of clock buffer outputs.

* * * * *